(12) United States Patent
Heng et al.

(10) Patent No.: US 9,490,378 B2
(45) Date of Patent: Nov. 8, 2016

(54) CONE SHAPED FOCUSING LENS

(71) Applicant: Avago Technologies General IP (Singapore) Pte. Ltd., Singapore (SG)

(72) Inventors: Cherng Woei Heng, Sembilan (MY); James Costello, Singapore (SG); Siong Lee Loh, Melaka (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 256 days.

(21) Appl. No.: 14/491,412

(22) Filed: Sep. 19, 2014

(65) Prior Publication Data

US 2016/0087117 A1    Mar. 24, 2016

(51) Int. Cl.
| | |
|---|---|
| *H01L 31/0232* | (2014.01) |
| *G02B 3/02* | (2006.01) |
| *H01L 31/0203* | (2014.01) |
| *H01L 31/18* | (2006.01) |

(52) U.S. Cl.
CPC ........... *H01L 31/02325* (2013.01); *G02B 3/02* (2013.01); *H01L 31/0203* (2013.01); *H01L 31/18* (2013.01)

(58) Field of Classification Search
CPC ............... H01L 31/02325; H01L 31/0203; H01L 31/18; G02B 3/02
USPC ........................................................ 250/216
See application file for complete search history.

(56) References Cited

U.S. PATENT DOCUMENTS

| 7,391,582 B2* | 6/2008 | Inui .................... G11B 7/0935 356/446 |
|---|---|---|
| 8,780,330 B2 | 7/2014 | Wada et al. |
| 2011/0194097 A1* | 8/2011 | Yamaguchi ............ G01C 3/085 356/4.01 |
| 2013/0292706 A1 | 11/2013 | Costello et al. |

FOREIGN PATENT DOCUMENTS

WO           2014013745           1/2014

* cited by examiner

*Primary Examiner* — Seung C Sohn

(57) ABSTRACT

An optical assembly can be used in various optical devices such as optical proximity sensors, gesture sensors, or imaging sensors. The optical assembly may include a lens assembly and a light detector. The lens assembly may be configured to limit off axis rays at a central area of the light detector. The lens assembly can be a high aspect ratio lens assembly.

20 Claims, 12 Drawing Sheets

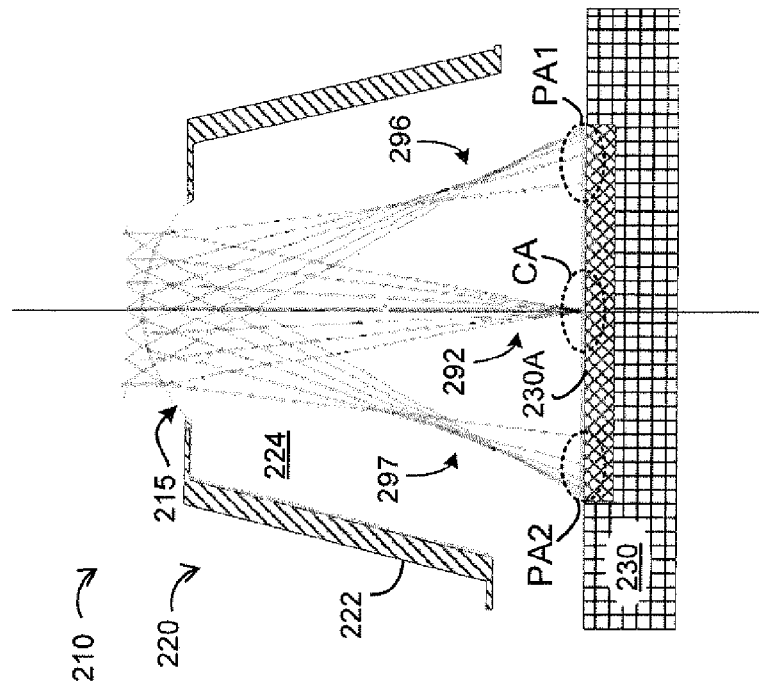
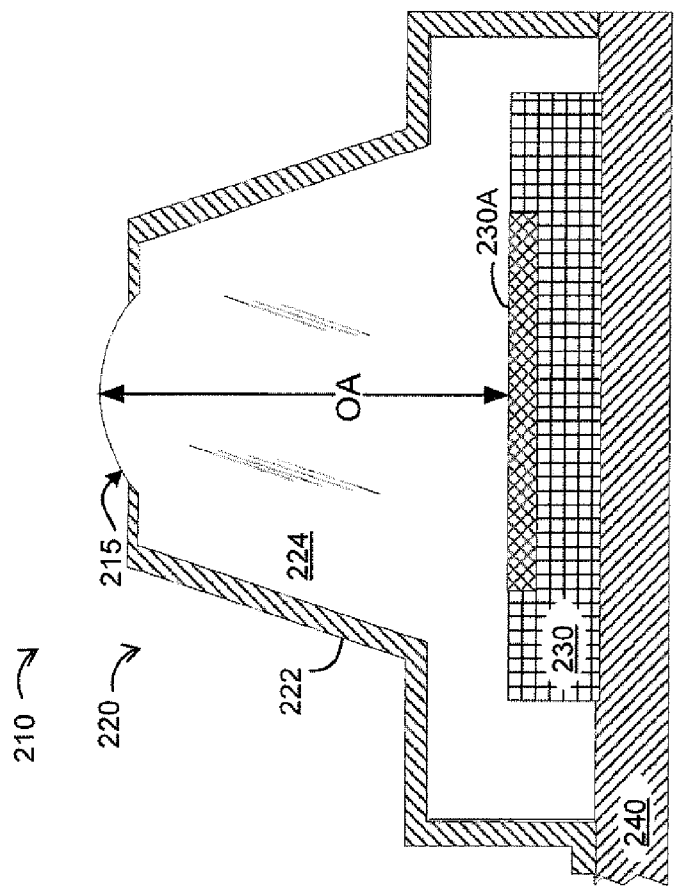

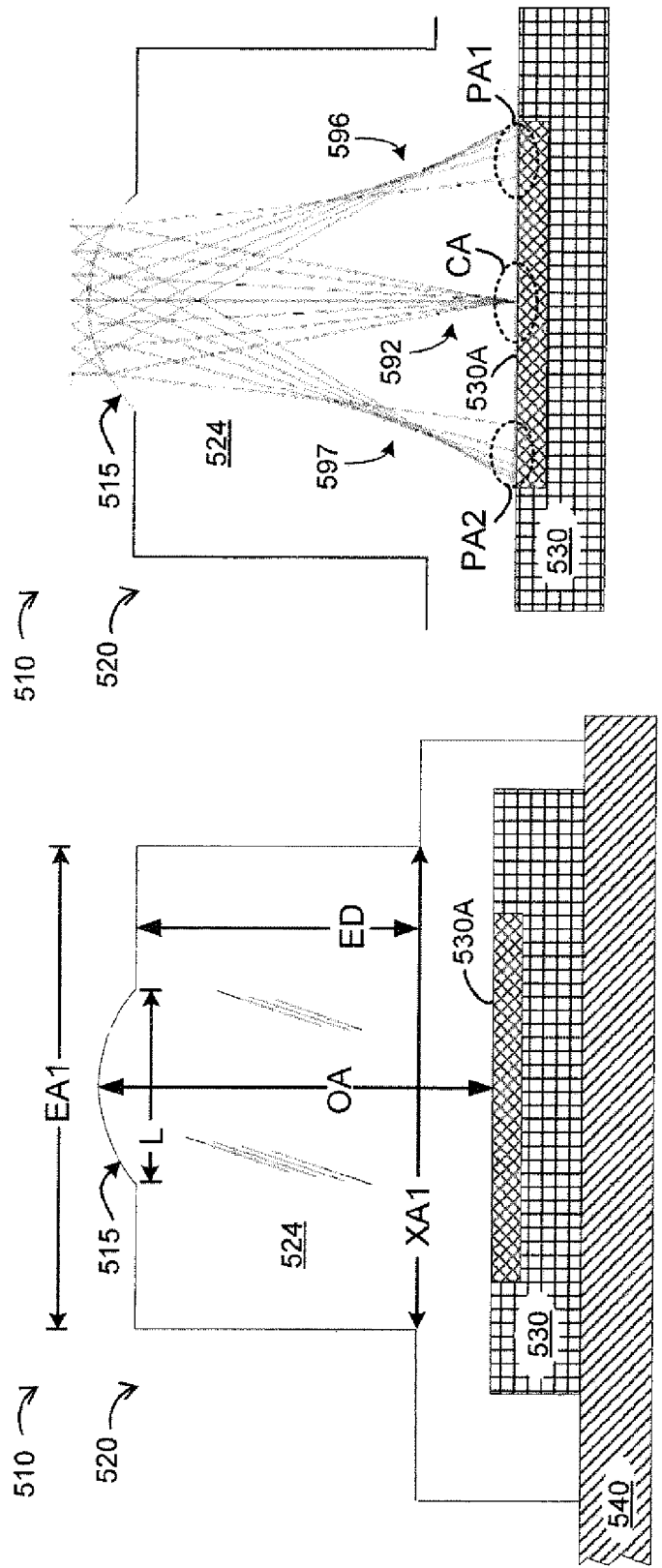

CONE SHAPED FOCUSING LENS

BACKGROUND

Mobile devices such as mobile phones are not only becoming smarter, they are also becoming more aware of their surroundings, so as to provide increasing capabilities and operating modes for their users. For example, a mobile phone may include an optical proximity sensor that can be used to detect different use modes, such as a phone call mode when the mobile phone is held close to a user's head, and a browsing display mode when the mobile phone is held further from the user's head, so as to provide comfortable browsing of information shown on a display of the mobile phone. Since the optical proximity sensor helps the mobile phone to be aware of its surroundings, the mobile phone can save power and extend battery life by automatically dimming the display when the mobile phone is held close to the user's head while operating in the phone call mode, but automatically maintain full display brightness when the mobile phone is held further from user's head, while operating in the browsing display mode.

Similarly, a mobile device, or more generally a computing device, may include a gesture sensor for optically detecting a gesture, such as a hand gesture of a user. A user can control or interact with the mobile device via the gesture sensor for a favorable and intuitive user experience.

Likewise, a mobile device, or more generally a computing device may include an imaging sensor for electronically capturing an optical image. For example, the mobile device can be secured by first recognizing the face of its owner via the imaging sensor before allowing access.

While the foregoing may provide many benefits in making mobile devices aware of their surroundings, and in particular aware of changes in their surroundings, those surroundings may present many challenges to optical designers. Such surroundings can be filled with unwanted optical signals, as well as optical signals of interest. Optics are needed that will collect optical signals of interest, while limiting unwanted optical signals. Further, while there may be some advantages to initially molding optics in liquid form, there is a need to limit bubbles when optics are initially molded in liquid form.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings are for illustrative purpose to assist understanding and may not be drawn per actual scale.

FIG. 2E shows a simplified partial cutaway side view of the optical assembly as shown in FIG. 2D.

FIG. 2F shows optical operation in a further simplified partial cutaway side view of the optical assembly as shown in FIG. 2E.

FIG. 5A shows a simplified partial cutaway side view of further yet another embodiment of the optical assembly.

FIG. 5B shows optical operation in a further simplified partial cutaway side view of the optical assembly embodiment as shown in FIG. 5A.

DETAILED DESCRIPTION

Figure 1:
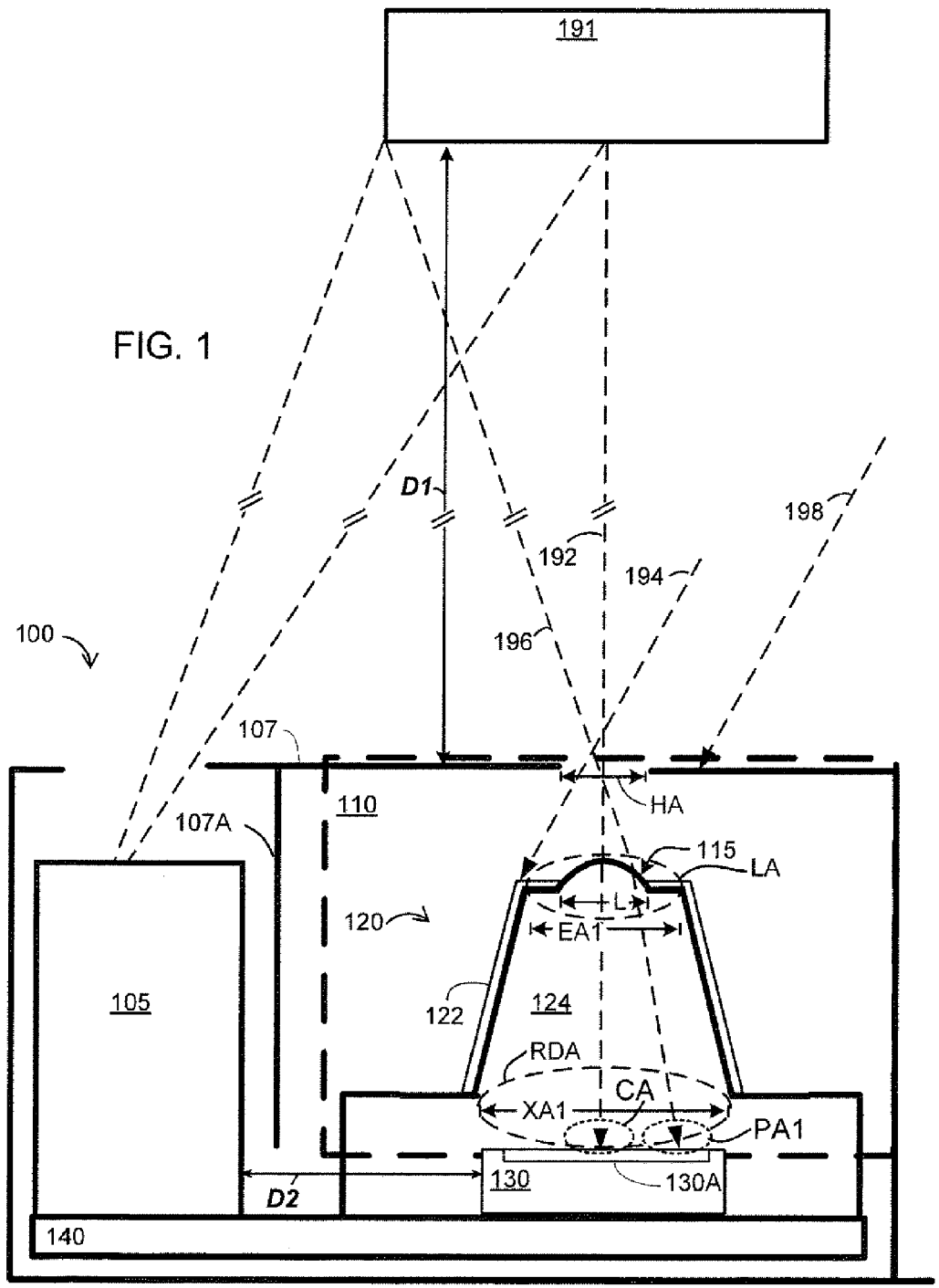
FIG. 1 shows a block diagram of one embodiment of an optical assembly.

FIG. 1 shows a block diagram of one embodiment of an optical assembly 100 employing a lens assembly 110. As shown in the embodiment of FIG. 1, the optical assembly 100 may be embodied as an optical proximity sensor 100. However, it should be understood that the optical assembly is not strictly limited to the embodiment as the optical proximity sensor 100, and the optical assembly 100 may be embodied in various other ways, for example, as a gesture sensor or image sensor employing the lens assembly 110. In particular, the optical assembly 100 may be configured to sense infrared and/or near infrared light, and may be embodied as an active near infrared image sensor.

Optical assembly 100 shown in FIG. 1 may comprise a light source 105, a light detector 130 having a central area, CA, and a substrate 140 upon which the light source 105 and light detector 130 can be mounted. Light source 105 may be an infrared light source 105. Light source 105 may comprise a light emitting diode, LED, and associated light source optics. Various components can be disposed at least partially within a housing 107.

Housing 107 can be made of an optically blocking material. Housing 107 may be configured to substantially block transmission of light and/or substantially absorb light. Housing 107 may be configured to substantially block transmission of infrared light and/or substantially absorb infrared light. Further, housing 107 may also be configured to substantially block transmission of visible light and/or substantially absorb visible light. Housing 107 may have a dark or black or substantially dark or substantially black visual appearance. In particular, housing 107 may have one or more internal wall structures 107A for at least partially blocking internal transmission of light within housing 107 from light source 105 to light detector 130. Further, at least some glare comprising skew light ray 198 (depicted by a dashed line arrow) may be blocked from entering the housing 107 by the optically blocking material of the housing 107.

The lens assembly 110 may be optically coupled with the light detector 130 to collect optical signals of interest, such as an optical proximity signal 192 reflected from external object 191. More particularly, FIG. 1 shows on axis image signal or ray 192 from external object 191. External object 191 may be located a distance, D1, from optical assembly 100. The distance, D1, from the optical assembly 100 to the external object 191 may be substantially greater than a distance, D2, from the light source 105 to light detector 130.

As illustrated in FIG. 1 by on axis light ray 192 (depicted by a dashed line arrow), light emitted from light source 105 can be reflected from a central region of external object 191 as on axis light ray 192 and directed through an optical axis of lens assembly 110 and/or focal lens surface 115, and in particular through an optical axis of housing aperture, HA, and/or aperture stop, HA, to a central area, CA, of light detector 130, where an active area 130A of light detector 130 is located, so as to optically detect proximity of external object 191 to the optical proximity detector 100. Similarly, light emitted from light source 105 can be reflected from an extremity of external object 191 as off axis light ray 196 (for example, chief ray 196) and directed through the optical axis of lens assembly 110, and in particular through the optical axis of housing aperture, HA, and/or aperture stop, HA, to a peripheral area, PA1, of the active area 130A of light detector 130. In addition to sensing proximity of external object 191, optical assembly 100 may sense an image of external object 191 formed by lens assembly 110 on the active area 130A of light detector 130, using at least on axis light ray 192 and off axis light ray 196 (for example, chief ray 196). In the foregoing, it should be understood: on axis light ray 192 can be substantially on axis relative to the optical axis of housing aperture, HA, and/or relative to the optical axis of lens assembly 110 and/or focal lens surface 115; and off axis light ray 196 can be substantially off axis relative to the optical axis of housing aperture, HA, and/or relative to the optical axis of lens assembly 110 and/or focal lens surface 115.

In addition to being configured to collect the on axis light ray 192 and to guide on axis light ray 192 to the central area, CA, of active area 130A of light detector 130, the lens assembly 110 (and more particularly components thereof) can also be configured to collect the off axis light ray 196 (and/or chief ray 196) and to guide off axis light ray 196 to peripheral area, PA1, of active area 130A of light detector 130. In particular, off axis light ray 196 (depicted by a dashed line arrow) may be guided by lens assembly 110 to peripheral area, PA1, away from the central area, CA, of light detector 130. Accordingly, by guiding off axis ray 196 to the peripheral area, PA1, lens assembly 110 can substantially limit scattering and/or interference of off axis light ray 196 at the central area, CA, of the light detector 130. In particular, by guiding off axis ray 196 to the peripheral area, PA1, lens assembly 110 can substantially limit scattering and/or interference of off axis ray 196 from being detected at the central area of the active area 130A of light detector 130.

The lens assembly 110 may comprise housing aperture, HA, and may further comprises a focal lens surface 115 having an optical axis portion extending from the focal lens surface 115 to the light detector 130. The focal lens surface 115 can have a surface profile substantially forming a portion of a cylinder or a sphere. Alternatively, focal lens surface 115 can comprise at least one of a multifocal lens surface and an aspheric focal lens surface.

The lens assembly 110 may further comprise a base portion 120 interposed between the focal lens surface 115 and the light detector 130 and configured to substantially limit scattering and/or interference from off axis ray 196 and/or glare from being received at the central area, CA, of the light detector 130 via the focal lens surface 115. The base portion 120 may comprise a solid optical member 124 having a surface portion that can be substantially at least one of graduated or tapered or conical and extending from a light detector area, proximate to the light detector 130, to a lens area, LA, proximate to the focal lens surface 115.

The focal lens surface 115 may be integrally formed with the solid optical member 124. The focal lens surface 115 and the solid optical member 124 can be initially molded in liquid form from uncured elastomeric encapsulant. The light detector 130 may be embodied as a chip or receiver die 130, which may be mounted on substrate 140. The lens assembly 110 can, or more particularly the solid optical member 124 of the base portion 120 of the lens assembly 110 can, encapsulate at least the portion of the receiver die 130 using the elastomeric encapsulant. The uncured elastomeric encapsulant can be cured from liquid form to solid form. The solid optical member 124 may comprise a wavelength selective member 124 that is substantially transparent to a first wavelength of light (and/or a first set of wavelengths of light) and substantially blocks and/or absorbs a second wavelength of light (and or a second set of wavelengths of light), wherein the first and second wavelengths (and/or the first and second sets of wavelengths) are substantially different from one another. For example, the solid optical member 124 may comprise a wavelength selective member 124 that may be substantially transparent to infrared light and may substantially block transmission of visible light and/or may substantially absorb visible light. More particularly the solid optical member 124 and/or wavelength selected member 124 may be made from elastomeric encapsulant material that may be substantially transparent to the first wavelength of light, and/or first set of wavelengths of light, for example, infrared light; and may substantially block transmission of the second wavelength of light, and/or second set of wavelengths of light, for example, visible light and/or may substantially absorb visible light. The solid optical member 124 and/or wavelength selective member 124 and/or elastomeric encapsulant material may have a dark or black or substantially dark or substantially black visual appearance, but still may be substantially transparent to infrared light.

The focal lens surface 115 and solid optical member 124 of the base portion 120 can be substantially devoid of air bubbles. A bubble limiting apparatus can be configured to substantially limit presence of bubbles between the focal lens surface 115 and the light detector/receiver die 130. The bubble limiting apparatus may comprise the solid optical member 124 having the member surface portion that can be substantially at least one of graduated or tapered or conical, and configured to substantially limit presence of bubbles between the focal lens surface 115 and the receiver die 130, when the solid optical member 124 is initially molded in liquid form.

Further, the lens assembly 110 can be a high aspect ratio lens assembly 110, optically coupled with the receiver die 130. In particular, the solid optical member 124 can be an elongated optical member 124 of the high aspect ratio lens assembly 110 having a narrow extremity arranged proximate to the focal lens surface 115 and a broad extremity arranged proximate to the receiver die 130. An elongated dimension of the elongated optical member 124 can extend along at least a majority of the portion of the optical axis of focal lens surface 115 extending from the narrow extremity of the elongated optical member 124 to the broad extremity of the elongated optical member 124. The elongated dimension of the elongated optical member 124 of the high aspect ratio lens assembly 110 can be substantially greater than a width dimension of the narrow extremity of the elongated optical member 124 of the high aspect ratio lens assembly 110, so as to provide the high aspect ratio of the high aspect ratio lens assembly 110. Further, the elongated optical member 124 can be interposed along the elongated dimension, between the focal lens surface 115 and the receiver die 130, so as to provide the high aspect ratio of the high aspect ratio lens assembly 110. Moreover, ratio of the elongated dimension of the elongated optical member 124 to the width dimension of the narrow extremity of the elongated optical member 124 can be substantially greater than approximately 1:1, so as to provide the high aspect ratio of the high aspect ratio lens assembly 110. Similarly, ratio of the elongated dimension of the elongated optical member 124 to width of the lens aperture, L, (and/or to width of the optical member entry aperture, EA1,) can be substantially greater than approximately 1:1, so as to provide the high aspect ratio of the high aspect ratio lens assembly 110.

Base portion 120 of the lens assembly can be interposed in base portion arrangement between the focal lens surface 115 and the receiver die 130 configured to substantially limit scattering and/or interference from off axis ray 196 and/or glare from being received at the central area, CA, of the receiver die 130 via the focal lens surface 115. The base portion 120 of the lens assembly 110 may comprise an optical barrier perimeter 122. For example, at least some glare comprising skew light ray 194 (depicted by a dashed line arrow) may be blocked by the optical barrier perimeter 122.

The optical barrier perimeter 122 may comprise an optical barrier surface layer 122 of light blocking material that can be substantially at least one of graduated or tapered or conical and extending from a receiver die area, RDA, proximate to the receiver die to lens area, LA, proximate to the focal lens surface 115. The optical barrier perimeter 122 (and/or optical barrier surface 122) can have a longitudinal dimension extending substantially along the portion of the optical axis of the focal lens surface 115, from proximate the focal lens surface 115 to proximate the receiver die 130.

As mentioned previously herein, the base portion 120 of the lens assembly 110 can further comprise solid optical member 124 likewise extending substantially along the portion of the optical axis of the focal lens surface 115, from the focal lens surface 115 to the receiver die 130. The solid optical member 124 may comprise a member surface portion that can be substantially at least one of graduated or tapered or conical and extending from receiver die area, RDA, proximate to the receiver die to lens area, LA, proximate to the focal lens surface 115. The optical barrier surface layer 122 can be applied in various ways, for example by first selectively masking and/or shielding the focal lens surface 115 with a selective mask/shield material, and then spraying light blocking material in liquid form onto solid optical member 124, and then curing the light blocking material from liquid to solid form, and then removing the selective mask/shield material from the focal lens surface 115.

The focal lens surface 115 can have a lens aperture, L, as shown in FIG. 1. The solid optical member 124 may have an optical member entry aperture, EA1, arranged proximate to the lens aperture, L, of the focal lens surface 115 and configured to substantially limit scattering and/or interference from off axis ray 196 from being received at the central area, CA, of the receiver die 130 via the focal lens surface 115. The optical member entry aperture, EA1, of the solid optical member 124 may be substantially larger than the lens aperture, L, of the focal lens surface 115. The optical barrier perimeter 122, may substantially cover/block a portion of the optical member entry aperture, EA1, of the solid optical member 124, and in particular may substantially cover/block the portion of the optical member entry aperture, EA1, that is substantially larger than the lens aperture, L. The housing aperture, HA, may be approximately the same size as the lens aperture, L, or the housing aperture, HA, may be substantially smaller than the lens aperture, L, shown in FIG. 1.

The solid optical member 124 may have an optical member exit aperture, XA1, arranged proximate to the receiver die 130 and configured to substantially limit scattering and/or interference from off axis ray 196 from being received at the central area, CA, of the receiver die 130 via the focal lens surface 115. In particular, the optical member exit aperture, XA1, of the solid optical member 124 can be configured to be substantially larger than the lens aperture, L, of the focal lens surface 115, (and the optical member exit aperture, XA1, of the solid optical member 124 can be configured to be substantially larger than the optical member entry aperture, EA1, of the solid optical member 124.) The optical member entry aperture, EA1, and the optical member exit aperture, XA1, can be interposed between the focal lens surface 115 and the receiver die 130 as shown in FIG. 1 and can be configured to operate together so as to substantially limit scattering and/or interference from off axis ray 196 from being received at the central area, CA, of the receiver die 130 via the focal lens surface 115. The solid optical member 124 can be configured to extend from the optical member entry aperture, EA1, to the optical member exit aperture, XA1, along at least a majority of the portion of the optical axis of the focal lens surface 115 extending from the focal lens surface 115 to the receiver die 130.

As mentioned previously herein, the forgoing components of lens assembly 110 can be configured to collect the on axis light ray 192 and to guide on axis light ray 192 to the central area, CA, of active area 130A of light detector 130; and the lens assembly 110 (and more particularly components thereof) can also be configured to collect the off axis light ray 196 (and/or, for example, chief ray 196) and to guide off axis light ray 196 to peripheral area, PA1, of active area 130A of light detector 130. By guiding off axis light ray 196 to peripheral area, PA1, of active area 130A of light detector 130, lens assembly 110 (and more particularly components thereof) can substantially limit scattering and/or interference from off axis ray 196 from being received at the central area, CA, of the light detector 130 via the focal lens surface. As shown in FIG. 1, on axis light ray 192 and off axis light ray 196 (and/or, for example, chief ray 196) can be guided by the lens assembly 110 along differing optical paths, after both are received by the focal lens surface 115. Components of lens assembly 110 can be configured to guide on axis light ray 192 from the focal lens surface 115, through the lens aperture, L, and through the optical member entry aperture, EA1, and the optical member exit aperture, XA1 of the solid optical member 124, to the central area, CA, of light detector 130, where the central area, CA, of active area 130A of light detector 130 is located, so as to optically detect on axis light ray 192 at the central area, CA, of light detector 130. However, in contrast, components of lens assembly 110 can be configured to guide off axis light ray 196 (and/or, for example, chief ray 196) from the focal lens surface 115 so as to be detected at a peripheral area, PA1, of the active area 130A of light detector 130, away from the central area, CA, of light detector 130, and away from where the central area, CA, of the active area 130A of light detector 130 is located. Accordingly, as mentioned previously, by guiding off axis light ray 196 (and/or, for example, chief ray 196) to the peripheral area, PA1, of the active area 130A of light detector 130, components of lens assembly 110 can substantially limit scattering and/or interference from off axis ray 196 from being received at the central area, CA, of the light detector 130 via focal lens surface 115. In particular, by guiding on axis light ray 192 to the central area, CA, while guiding off axis light ray 196 (for example, chief ray 196) to the peripheral area, PA1, components of lens assembly 110 can be configured to form an image of external object 191 on pixels of the active area 130A of light detector 130, using at least on axis light ray 192 and off axis light ray 196 (for example, chief ray 196).

It should be understood that while guiding off axis light ray 196 to the peripheral area, PA1, the foregoing arrangement can substantially avoid otherwise surface scattering the off axis light ray 196 into the central area, CA, of the active area 130A, located at the central area, CA, of receiver die 130.

In order to provide for substantially avoiding surface scattering off axis light ray 196 into the central area, CA, of active area 130A located at the central area, CA, of receiver die 130 via focal lens surface 115: the optical member exit aperture, XA1, of the solid optical member 124 can be configured to be substantially larger than the lens aperture, L, of the focal lens surface 115; and the optical member exit aperture, XA1, of the solid optical member 124 can be configured to be substantially larger than the optical member entry aperture, EA1, of the solid optical member 124; and member surface portion of solid optical member 124 can be substantially at least one of graduated or tapered or conical and extending from receiver die area, RDA, proximate to the receiver die to lens area, LA, proximate to the focal lens surface.

Figure 2A:
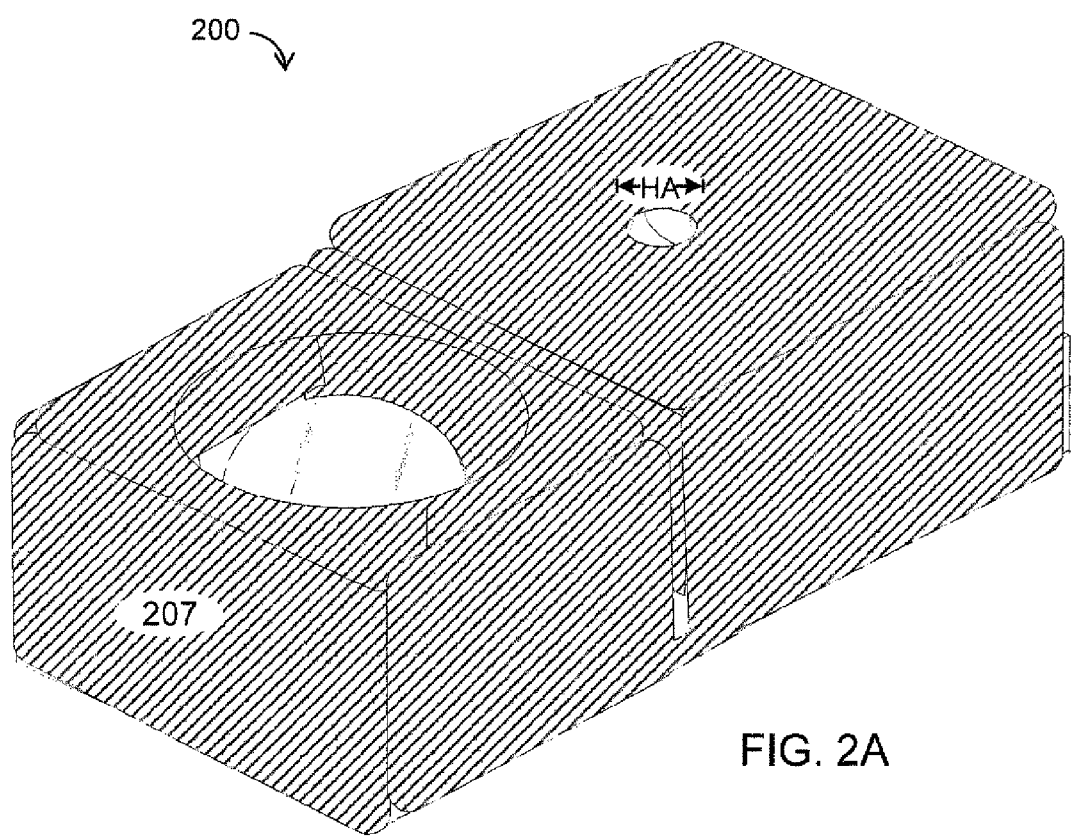
FIG. 2A shows a perspective view of the optical assembly of FIG. 1.

FIG. 2A shows a perspective view of the optical assembly of FIG. 1. FIG. 2A shows optical assembly 200, which may include housing 207. Housing aperture, HA, may be disposed in housing 207. As indicated previously herein, various components can be disposed at least partially within housing 207.

Figure 2B:
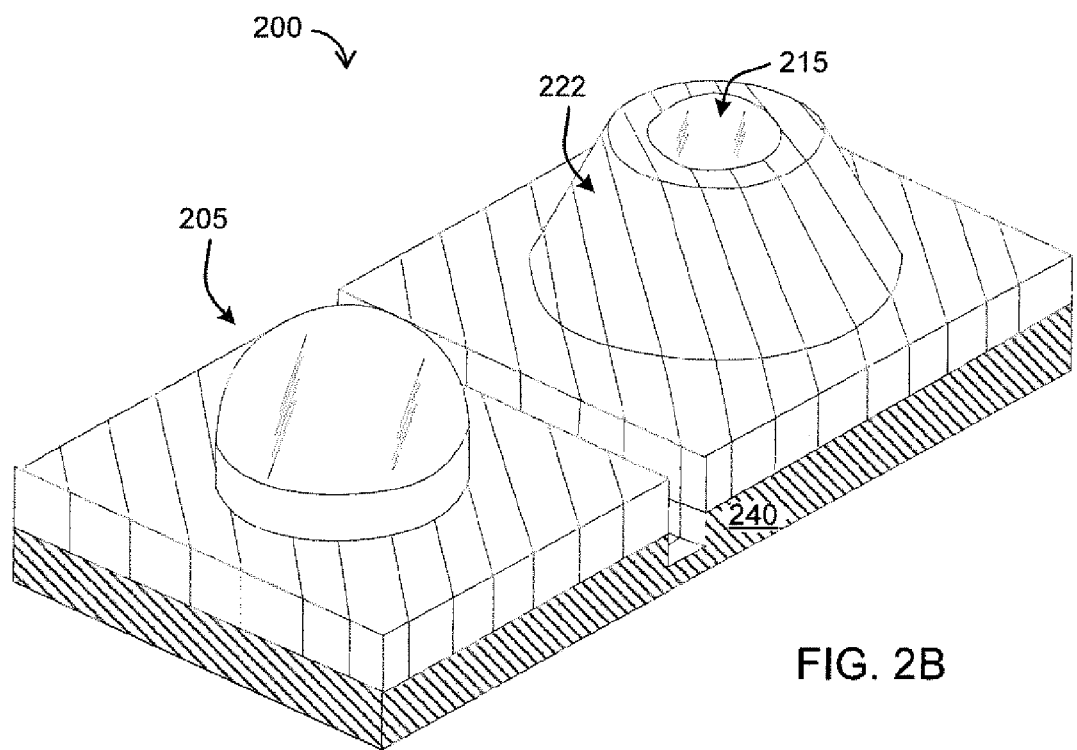
FIG. 2B shows a perspective view of the optical assembly as shown in FIG. 2A, but with the housing removed.

FIG. 2B shows a perspective view of the optical assembly as shown in FIG. 2A, but with the housing removed. FIG. 26 shows optical assembly 200, which may comprise light source 205 and associated light source optics mounted on substrate 240. Also shown is focal lens surface 215 and optical barrier perimeter 222.

Figure 2C:
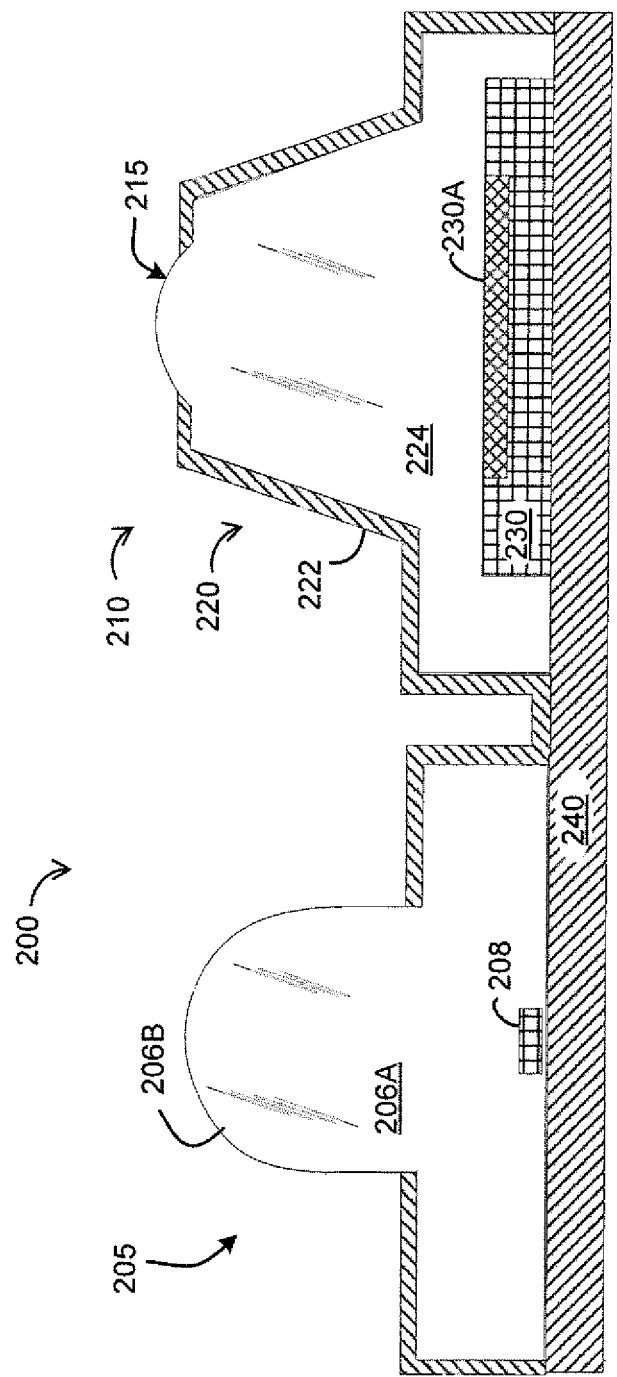
FIG. 2C shows a cutaway side view of the optical assembly as shown in FIG. 2B.

FIG. 2C shows a cutaway side view of the optical assembly as shown in FIG. 2B. FIG. 2C shows optical assembly 200, which may comprise light source 205. Light source 205 may comprise light emitting diode 208 and associated light source optics of light source member 206A and light source lens 206B, mounted on substrate 240.

Also shown is lens assembly 210 optically coupled with light detector 230. The detector light detector 230 may be embodied as chip or receiver die 230, which may be mounted on substrate 240. Receiver die 230 may have the central area, where the active area 230A of receiver die 230 may be located. Lens assembly 210 may comprise base portion 220. The base portion 220 may comprise solid optical member 224 having surface portion that can be substantially at least one of graduated or tapered or conical. Base portion 220 may further comprise optical barrier perimeter 222, which may have optical barrier surface layer of light blocking material that can be substantially at least one of graduated or tapered or conical. Base portion 220 may be interposed between focal lens surface 215 and the light detector 230 and configured to substantially limit scattering and/or interference from off axis ray from being received at the central area of the light detector 230 via the focal lens surface 215.

Figure 2D:
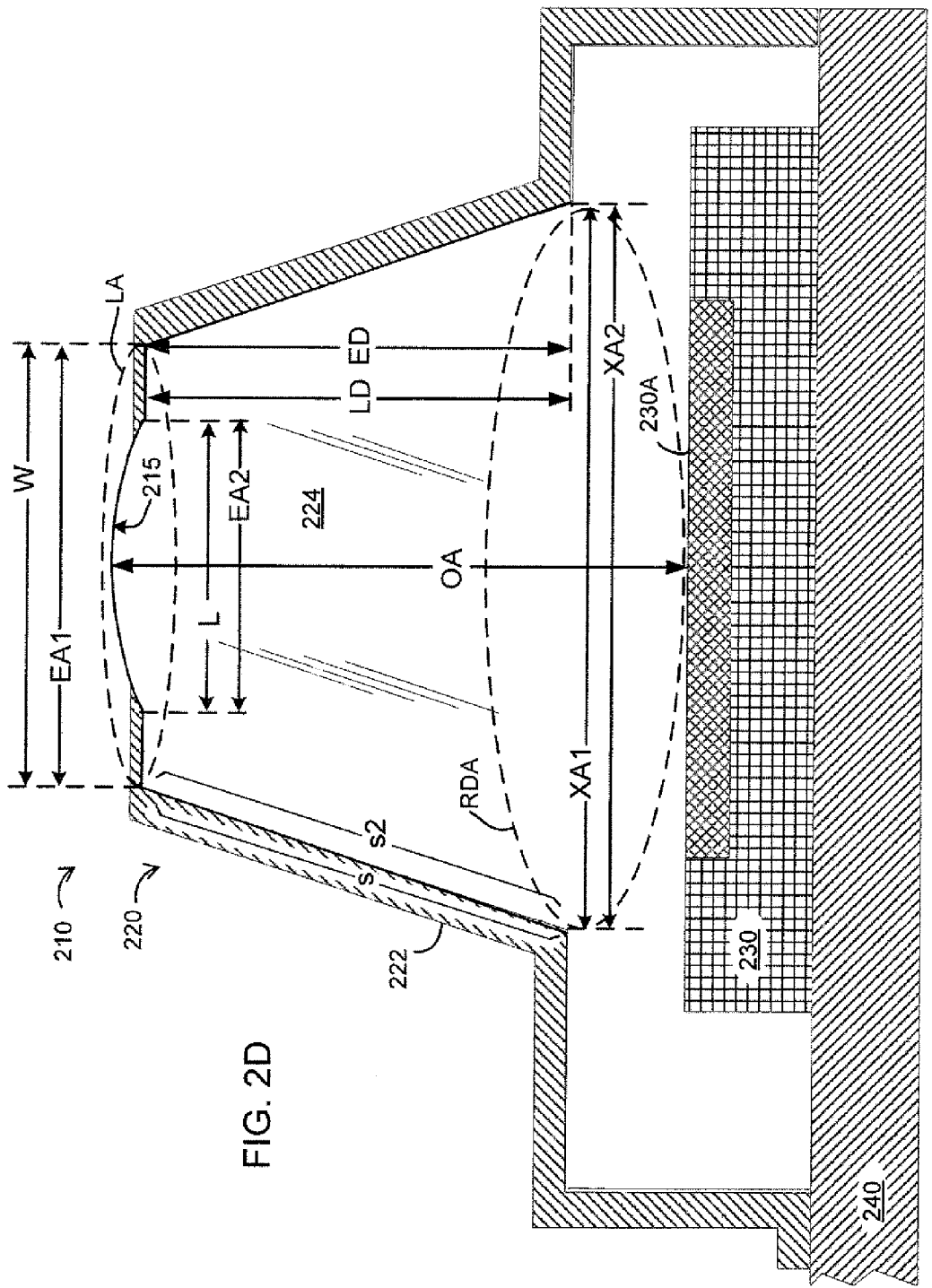
FIG. 2D shows an enlarged partial cutaway side view of the optical assembly as shown in FIG. 2C.

FIG. 2D shows an enlarged partial cutaway side view of the optical assembly as shown in FIG. 2C. FIG. 2D particularly shows the lens assembly 210, which may comprise focal lens surface 215 having an optical axis portion, OA, extending from the focal lens surface 215 to receiver die 230. Receiver die 230 may have the central area, where the active area 230A of receiver die 230 may be located.

The lens assembly 210 may further comprise base portion 220 interposed between the focal lens surface 215 and receiver die 230 and configured to substantially limit scattering and/or interference from the off axis ray from being received at the central area of the receiver die 230 via the focal lens surface 215. The base portion 220 may comprise solid optical member 224 having surface portion that can be substantially at least one of graduated or tapered or conical and extending from a light detector area, proximate to the light detector 230, to a lens area, LA, proximate to the focal lens surface 215. As shown in FIG. 2D, the lens assembly 210 can, or more particularly the solid optical member 224 of the base portion 220 of the lens assembly 210 can encapsulate at least the portion of the receiver die 230.

As indicated previously herein, the lens assembly 210 can be a high aspect ratio lens assembly 210, optically coupled with the receiver die 230. In particular, the solid optical member 224 can be an elongated optical member 224 of the high aspect ratio lens assembly 210 having a narrow extremity arranged proximate to the focal lens surface 215 and a broad extremity arranged proximate to the receiver die 230. An elongated dimension, ED, of the elongated optical member 224 can extend from the narrow extremity of the elongated optical member 224 to the broad extremity of the elongated optical member 224, substantially along at least a majority of the optical axis portion, OA, of the focal lens surface 215 extending from the focal lens surface 215 to the receiver die 230. The elongated dimension, ED, of the elongated optical member 224 of the high aspect ratio lens assembly 210 can be substantially greater than a width dimension, W, of the narrow extremity of the elongated optical member 224 of the high aspect ratio lens assembly 210, so as to provide the high aspect ratio of the high aspect ratio lens assembly 210. Further, the elongated optical member 224 can be interposed along the elongated dimension, between the focal lens surface 215 and the receiver die 230, so as to provide the high aspect ratio of the high aspect ratio lens assembly 210. Moreover, ratio of the elongated dimension, ED, of the elongated optical member 224 to the width dimension, W, of the narrow extremity of the elongated optical member 224 can be substantially greater than approximately 1:1, so as to provide the high aspect ratio of the high aspect ratio lens assembly 210. Similarly, ratio of the elongated dimension, ED, of the elongated optical member 224 to width of the lens aperture, L, (and/or to width of the optical member entry aperture, EA1 and/or to width of the optical barrier entry aperture, EA2,) can be substantially greater than approximately 1:1, so as to provide the high aspect ratio of the high aspect ratio lens assembly 210.

Base portion 220 of the lens assembly can be interposed in base portion arrangement between the focal lens surface 215 and the receiver die 230 configured to substantially limit scattering and/or interference from the off axis ray from being received at the central area of the receiver die 230 via the focal lens surface 215. The base portion 220 of the lens assembly 210 may comprise optical barrier perimeter 222. The optical barrier perimeter 222 may comprise optical barrier surface layer, s, of light blocking material that can be substantially at least one of graduated or tapered or conical and extending from a receiver die area, RDA, proximate to the receiver die, to lens area, LA, proximate to the focal lens surface 215. The optical barrier perimeter 222 can have longitudinal dimension, LD, extending substantially from proximate the focal lens surface 215 to proximate the receiver die 230, substantially along at least the majority of the optical axis portion, OA, of the focal lens surface 215.

As mentioned previously herein, base portion 220 of the lens assembly 210 can further comprise solid optical member 224 likewise extending substantially along at least the majority of the optical axis portion, OA, of the focal lens surface 215 from the focal lens surface 215 to the receiver die 230. The solid optical member 224 may comprise member surface portion, s2, that can be substantially at least one of graduated or tapered or conical and extending from receiver die area, RDA, proximate to the receiver die to lens area, LA, proximate to the focal lens surface 215.

The focal lens surface 215 can have lens aperture, L, as shown in FIG. 2D. The solid optical member 224 may have optical member entry aperture, EA1, arranged proximate to the lens aperture, L, of the focal lens surface 215 and configured to substantially limit scattering and/or interference from the off axis ray from being received at the central area of the receiver die 230 via the focal lens surface 215. The optical member entry aperture, EA1, of the solid optical member 224 may be substantially larger than the lens aperture, L, of the focal lens surface 215. The optical barrier perimeter 222, may substantially cover/block a portion of the optical member entry aperture, EA1, of the solid optical member 224, and in particular may substantially cover/block the portion of the optical member entry aperture, EA1, that is substantially larger than the lens aperture, L.

The solid optical member 224 may have optical member exit aperture, XA1, arranged proximate to the receiver die 230 and configured to substantially limit scattering and/or interference from the off axis ray from being received at the central area, of the receiver die 230 via the focal lens surface 215. The optical member entry aperture, EA1, and the optical member exit aperture, XA1, can be interposed between the focal lens surface 215 and the receiver die 230 as shown in FIG. 2D and can be configured to operate together so as to substantially limit scattering and/or interference from the off axis ray from being received at the central area of the receiver die 230 via the focal lens surface 215.

As shown in FIG. 2D, the optical member exit aperture, XA1, of the solid optical member 224 can be substantially larger than the optical member entry aperture, EA1, of the solid optical member 224. The solid optical member 224 can be configured to extend from the optical member entry aperture, EA1, to the optical member exit aperture, XA1, substantially along at least the majority of the optical axis portion, OA, from the focal lens surface 215 to the receiver die 230.

Similarly, the optical barrier perimeter 222 can have an optical barrier entry aperture, EA2, arranged proximate to the lens aperture, L, of the focal lens surface 215 and configured to substantially limit scattering and/or interference from the off axis ray from being received at the central area, of the receiver die 230 via the focal lens surface 215. The optical barrier entry aperture, EA2, of the optical barrier perimeter 222 can be approximately that same size as the lens aperture, L, of the focal lens surface 215.

The optical barrier perimeter 222 can have an optical barrier exit aperture XA2 arranged proximate to the receiver die 230 and configured to substantially limit scattering and/or interference from the off axis ray from being received at the central area, of the receiver die 230 via the focal lens surface 215. In other words, the optical barrier perimeter 222 may have the optical barrier entry aperture EA2 and the optical barrier exit aperture, XA2, interposed between the focal lens surface 215 and the receiver die 230 and configured to substantially limit scattering and/or interference from the off axis ray from being received at the central area of the receiver die 230 via the focal lens surface 215.

In order to provide for substantially avoiding surface scattering from off axis ray into the central area of active area 230A of receiver die 230 via focal lens surface 215: the optical member exit aperture, XA1, of the solid optical member 224 can be configured to be substantially larger than the lens aperture, L, of the focal lens surface 215; and the optical member exit aperture, XA1, of the solid optical member 224 can be configured to be substantially larger than the optical member entry aperture, EA1, of the solid optical member 224; optical barrier surface layer, s, of light blocking material can be substantially at least one of graduated or tapered or conical; and member surface portion, s2, of solid optical member 224 can be substantially at least one of graduated or tapered or conical. In particular, it should be understood: the foregoing arrangement of optical barrier surface layer, s, may substantially avoid surface scattering of off axis ray at optical barrier surface layer, s, and into the central area of receiver die 230; and the foregoing arrangement of member surface portion, s2, may substantially avoid surface scattering of off axis ray at member surface portion, s2, and into the central area of receiver die 230.

FIG. 2E shows a simplified partial cutaway side view of the optical assembly as shown in FIG. 2D. FIG. 2F shows optical operation in a further simplified partial cutaway side view of the optical assembly as shown in FIG. 2E. FIGS. 2E and 2F both show lens assembly 210 optically coupled with light detector receiver die 230. Receiver die 230 may have the central area, CA, where the central area, CA, of the active area 230A of receiver die 230 may be located. Lens assembly 210 may comprise base portion 220. The base portion 220 may comprise solid optical member 224 having surface portion that can be substantially at least one of graduated or tapered or conical. Base portion 220 may further comprise optical barrier perimeter 222, which may have optical barrier surface layer of light blocking material that can be substantially at least one of graduated or tapered or conical. Base portion 220 may be interposed between focal lens surface 215 and the light detector 230 and configured to substantially limit scattering and/or interference from off axis rays 296, 297 from being received at the central area, CA, of the light detector 230 via the focal lens surface 215. Focal lens surface 215 may have optical axis portion, OA, extending from the focal lens surface 215 to receiver die 230.

As particularly shown in optical operation as depicted in FIG. 2F, in addition to being configured to collect the on axis light ray 292 to the central area, CA, of active area 230A of light detector 230, the lens assembly 210 (and more particularly components thereof) can also be configured to collect the off axis light rays 296, 297 (and/or chief rays 296, 297) and to guide off axis light rays 296,297 to peripheral areas PA1, PA2 of active area 230A of light detector 230. Accordingly, by guiding off axis rays 296, 297 to the peripheral areas PA1, PA2, the lens assembly 210 can limit scattering and/or interference of off axis light rays 296, 297 from being received at the central area, CA, of the light detector 230 via focal lens surface 215. The focal lens surface 215 can receive on axis light rays 292 as well as off axis light rays 296, 297. Otherwise possible surface scattering of off axis light rays 296, 297, if not substantially avoided, could otherwise interfere with central area, CA, of the active area 230A of light detector 230 detecting the on axis light rays 292. For example, off axis light rays 296, 297 may be guided by lens assembly 210 to peripheral areas, PA1, PA2 of the active area 230A of light detector 230, away from the central area, CA, of light detector 230, and away from where the central area, CA, of the active area 230A of light detector 230 is located. Accordingly, by guiding off axis light rays 296, 297 to the peripheral areas, PA1, PA2, lens assembly 210 can substantially limit scattering and/or interference of off axis light rays 296, 297 from being received at the central area, CA, of the light detector 230. In particular, by guiding off axis rays 296, 297 to peripheral areas, PA1, PA2, lens assembly 210 can substantially limit scattering and/or interference of off axis light rays 296, 297 from being detected at the central area, CA, of the active area 230A of light detector 230. It should be understood that in the various previous figures just discussed, the optical assembly 200 may be embodied as the active near infrared image sensor 200 and/or the gesture sensor 200 and/or image sensor 200 and/or optical proximity sensor 200.

Figure 3A:
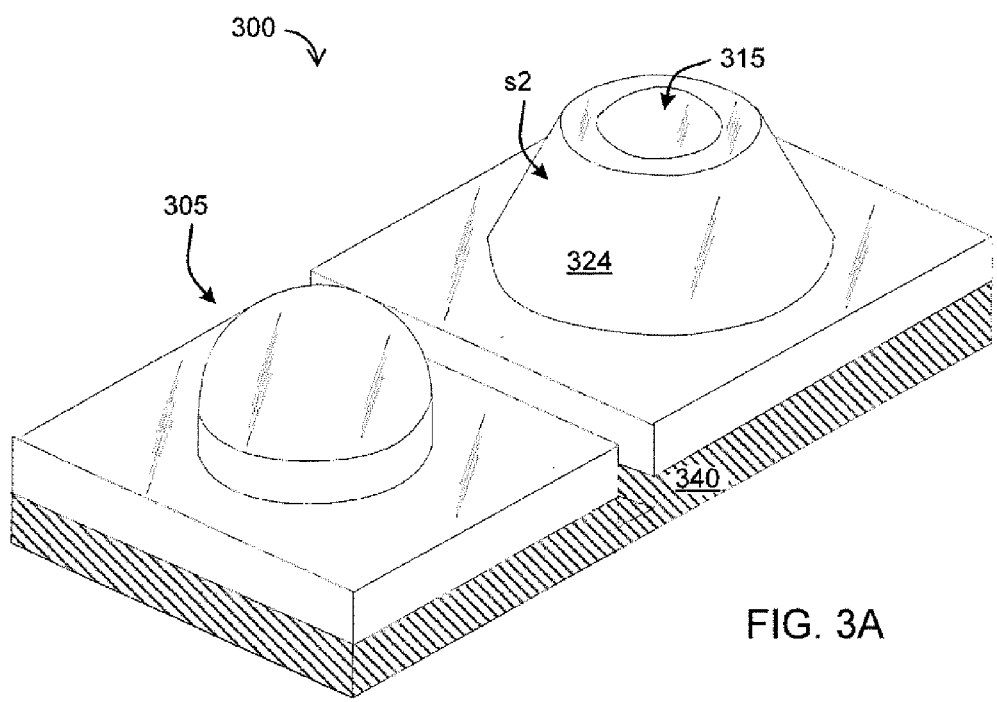
FIG. 3A shows a perspective view of another embodiment of the optical assembly.

FIG. 3A shows a perspective view of another embodiment of the optical assembly. Although embodiments discussed previously herein included the optical barrier perimeter, other embodiments need not strictly require including the optical barrier perimeter. For example, the additional embodiment of optical assembly 300 shown in FIG. 3A does not include the previously discussed optical barrier perimeter. The optical assembly 300 as shown in FIG. 3A may comprise light source 305 and associated light source optics mounted on substrate 340. Also shown is focal lens surface 315, solid optical member 324 and member surface portion, s2, that can be substantially at least one of graduated or tapered or conical. As mentioned previously herein, the solid optical member 324 may comprise a wavelength selective member 324 that is substantially transparent to a first wavelength of light (and/or a first set of wavelengths of light) and substantially blocks and/or absorbs a second wavelength of light (and or a second set of wavelengths of light), wherein the first and second wavelengths (and/or the first and second sets of wavelengths) are substantially different from one another. For example, solid optical member 324 may comprise a wavelength selective member 324 that may be substantially transparent to infrared light and may substantially block transmission of visible light and/or may substantially absorb visible light. More particularly the solid optical member 324 and/or wavelength selected member 324 may be made from elastomeric encapsulant material that may be substantially transparent to the first wavelength of light, and/or first set of wavelengths of light, for example, infrared light; and may substantially block transmission of the second wavelength of light, and/or second set of wavelengths of light, for example, visible light and/or may substantially absorb visible light. The solid optical member 324 and/or wavelength selective member 324 and/or elastomeric encapsulant material may have a dark or black or substantially dark or substantially black visual appearance, but still may be substantially transparent to infrared light.

Figure 3B:
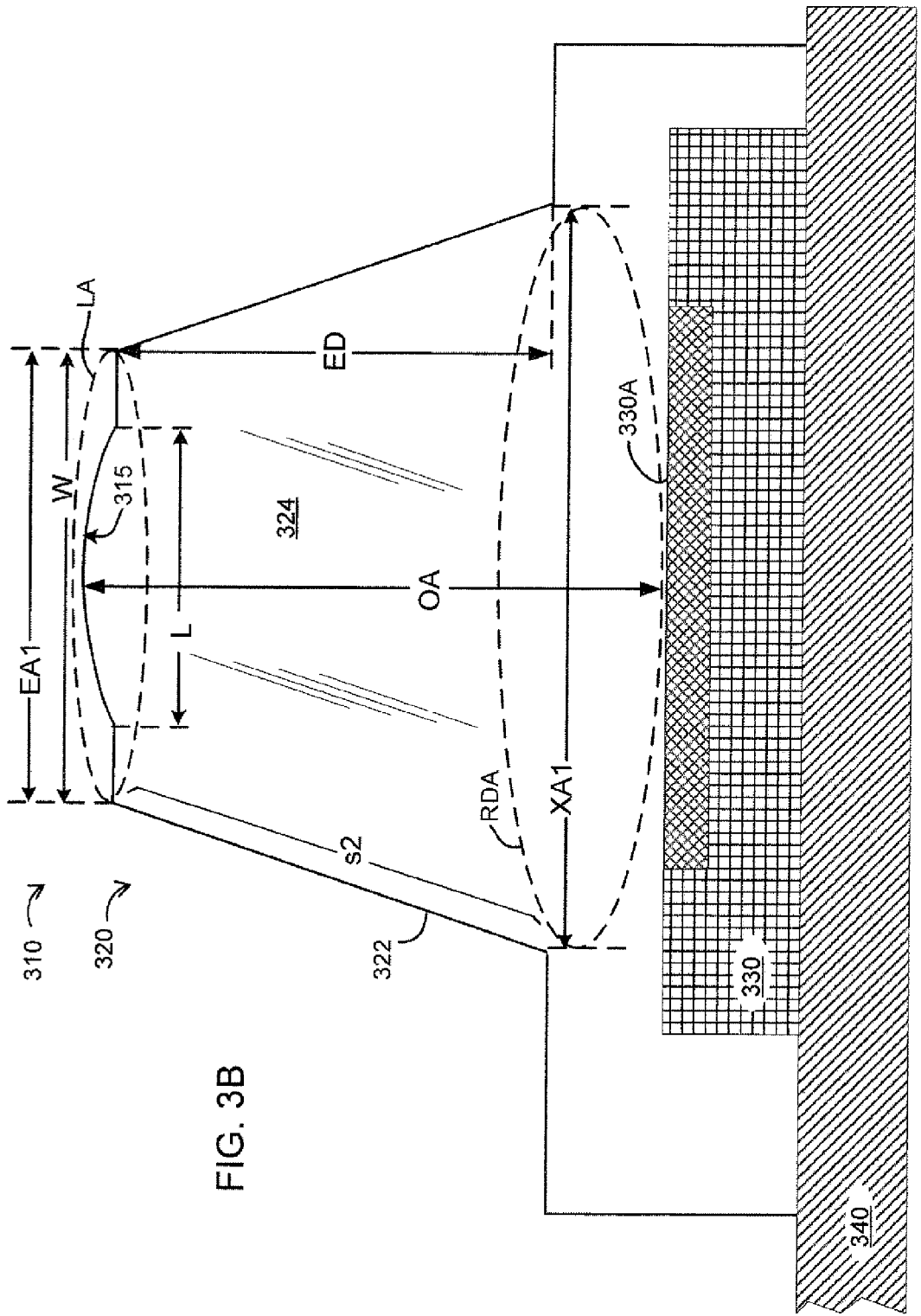
FIG. 3B shows an enlarged partial cutaway side view of the optical assembly embodiment as shown in FIG. 3A.

FIG. 3B shows an enlarged partial cutaway side view of the optical assembly embodiment as shown in FIG. 3A. FIG. 3B particularly shows the lens assembly 310, which may comprise focal lens surface 315 having an optical axis portion, OA, extending from the focal lens surface 315 to receiver die 330. Receiver die 330 may have the central area, where the active area 330A of receiver die 330 may be located.

The lens assembly 310 may further comprise base portion 320 interposed between the focal lens surface 315 and receiver die 330 and configured to substantially limit scattering and/or interference from the off axis light ray from being received at the central area of the receiver die 330 via the focal lens surface 315. The base portion 320 may comprise solid optical member 324 having surface portion that can be substantially at least one of graduated or tapered or conical and extending from a receiver die area, RDA, proximate to the light detector 330, to lens area, LA, proximate to the focal lens surface 315. As shown in FIG. 3B, the lens assembly 310 can, or more particularly the solid optical member 324 of the base portion 320 of the lens assembly 310 can encapsulate at least the portion of the receiver die 330.

As indicated previously herein, the lens assembly 310 can be a high aspect ratio lens assembly 310, optically coupled with the receiver die 330. In particular, the solid optical member 324 can be an elongated optical member 324 of the high aspect ratio lens assembly 310 having a narrow extremity arranged proximate to the focal lens surface 315 and a broad extremity arranged proximate to the receiver die 330. An elongated dimension, ED, of the elongated optical member 324 can extend from the narrow extremity of the elongated optical member 324 to the broad extremity of the elongated optical member 324, substantially along at least a majority of the portion of the optical axis, OA, of the focal lens surface, extending from the focal lens surface 315 to the receiver die, 330. The elongated dimension, ED, of the elongated optical member 324 of the high aspect ratio lens assembly 310 can be substantially greater than a width dimension, W, of the narrow extremity of the elongated optical member 324 of the high aspect ratio lens assembly 310, so as to provide the high aspect ratio of the high aspect ratio lens assembly 310. Further, the elongated optical member 324 can be interposed along the elongated dimension, between the focal lens surface 315 and the receiver die 330, so as to provide the high aspect ratio of the high aspect ratio lens assembly 310. Moreover, ratio of the elongated dimension, ED, of the elongated optical member 324 to the width dimension, W, of the narrow extremity of the elongated optical member 324 can be substantially greater than approximately 1:1, so as to provide the high aspect ratio of the high aspect ratio lens assembly 310. Similarly, ratio of the elongated dimension, ED, of the elongated optical member 324 to width of the lens aperture, L, (and/or to width of the optical member entry aperture, EA1,) can be substantially greater than approximately 1:1, so as to provide the high aspect ratio of the high aspect ratio lens assembly 310.

Base portion 320 of the lens assembly can be interposed in base portion arrangement between the focal lens surface 315 and the receiver die 330 configured to substantially limit scattering and/or interference from the off axis light ray from being received at the central area of the receiver die 330 via the focal lens surface 315. Base portion 320 of the lens assembly 310 can comprise solid optical member 324 extending substantially along at least the majority of the portion of the optical axis, OA, extending from the focal lens surface 315 to the receiver die 330. The solid optical member 324 may comprise member surface portion, s2, that can be substantially at least one of graduated or tapered or conical and extending from receiver die area, RDA, proximate to the receiver die to lens area, LA, proximate to the focal lens surface.

The focal lens surface 315 can have lens aperture, L, as shown in FIG. 3B. The solid optical member 324 may have optical member entry aperture, EA1, arranged proximate to the lens aperture, L, of the focal lens surface 315 and configured to substantially limit scattering and/or interference from the off axis light ray from being received at the central area of the receiver die 330 via the focal lens surface 315. The optical member entry aperture, EA1, of the solid optical member 324 may be substantially larger than the lens aperture, L, of the focal lens surface 315. A peripheral portion of the optical member entry aperture, EA1, of the solid optical member 324 may be roughened (or, more generally, may have a light transmission blocking treatment) so as to substantially block light transmission through the peripheral portion of the optical member entry aperture, EA1, of the solid optical member 324. In particular, the peripheral portion of the optical member entry aperture, EA1, that is substantially larger than the lens aperture, L, may be roughened (or, more generally, may have a light transmission blocking treatment) so as to substantially block light transmission through the peripheral portion of the optical member entry aperture, EA1.

The solid optical member 324 may have optical member exit aperture, XA1, arranged proximate to the receiver die 330 and configured to substantially limit scattering and/or interference from the off axis light ray from being received at the central area, of the receiver die 330 via the focal lens surface 315. The optical member entry aperture, EA1, and the optical member exit aperture, XA1, can be interposed between the focal lens surface 315 and the receiver die 330 as shown in FIG. 3B and can be configured to operate together so as to substantially limit scattering and/or interference from the off axis light ray from being received at the central area of the receiver die 330 via the focal lens surface 315.

As shown in FIG. 3B, the optical member exit aperture, XA1, of the solid optical member 324 can be substantially larger than the optical member entry aperture, EA1, of the solid optical member 324. The solid optical member 324 can be configured to extend from the optical member entry aperture, EA1, to the optical member exit aperture, XA1, substantially along at least the majority of the portion of the optical axis, OA, of the focal lens surface, extending from the focal lens surface 315 to the receiver die 330.

Figure 3D:
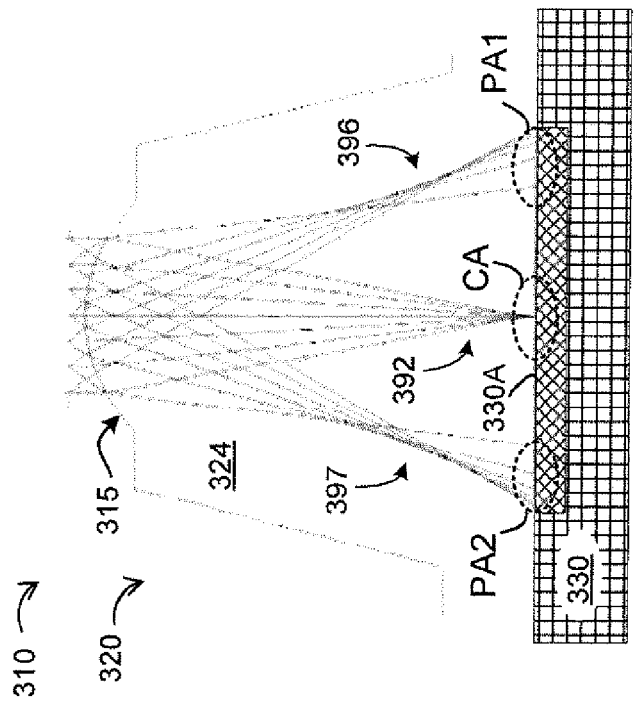
FIG. 3D shows optical operation in a further simplified partial cutaway side view of the optical assembly embodiment as shown in FIG. 3C.
Figure 3C:
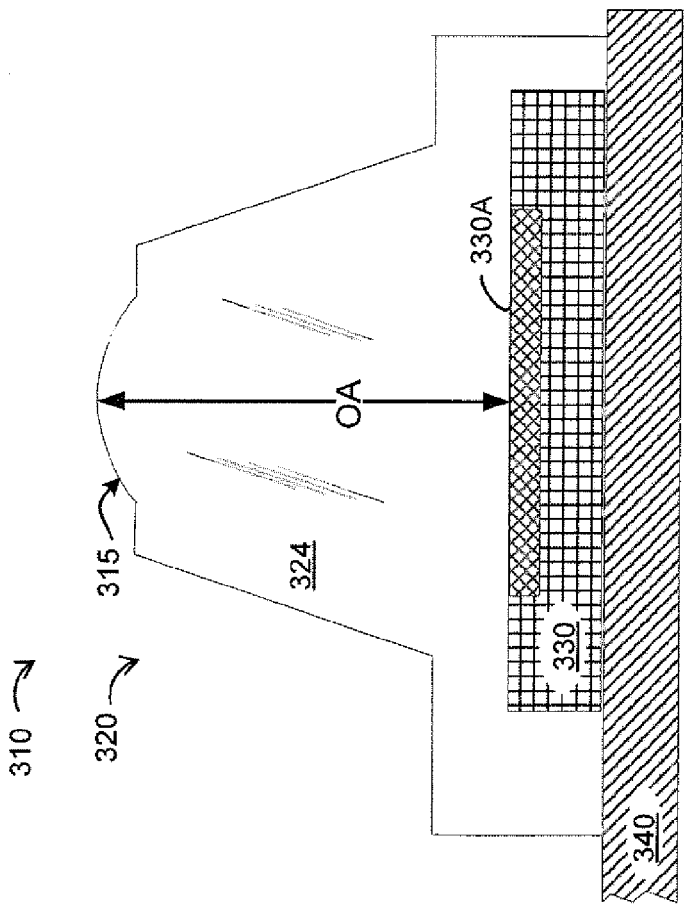
FIG. 3C shows a simplified partial cutaway side view of the optical assembly embodiment as shown in FIG. 3B.

FIG. 3C shows a simplified partial cutaway side view of the optical assembly embodiment as shown in FIG. 3B. FIG. 3D shows optical operation in a further simplified partial cutaway side view of the optical assembly embodiment as shown in FIG. 3C. Focal lens surface 315 may have optical axis portion, OA, extending from the focal lens surface 315 to receiver die 330.

FIGS. 3C and 3D both show lens assembly 310 optically coupled with light detector receiver die 330. Receiver die 330 may have the central area, CA, where the active area 330A of receiver die 330 may be located. Lens assembly 310 may comprise base portion 320. The base portion 320 may comprise solid optical member 324 having surface portion that can be substantially at least one of graduated or tapered or conical. Base portion 320 may be interposed between focal lens surface 315 and the light detector 330 and configured to substantially limit scattering and/or interference from the off axis light ray from being received at the central area of the light detector 330 via the focal lens surface 315. In the foregoing, it should be understood: on axis light rays 392 can be substantially on axis relative to the optical axis portion, OA, of focal lens surface 315; and off axis light rays 396, 397 can be substantially off axis relative the optical axis portion, OA, of focal lens surface 315.

As particularly shown in optical operation as depicted in FIG. 3D, in addition to being configured to collect the on axis light ray 392 to the central area, CA, of active area 330A of light detector 330, the lens assembly 310 (and more particularly components thereof) can also be configured to collect the off axis light rays 396, 397 (and/or chief rays 396, 397) and to guide off axis light rays 396, 397 to peripheral areas PA1, PA2 of active area 330A of light detector 330. Accordingly, by guiding off axis rays 396, 397 to the peripheral areas PA1, PA2, the lens assembly 310 can limit scattering and/or interference of off axis light rays 396, 397 at the central area, CA, of the light detector 330 via focal lens surface 315. The focal lens surface 315 can receive on axis light rays 392 as well as off axis light rays 396, 397. Otherwise possible surface scattering of off axis light rays 396, 397, if not substantially avoided, could otherwise interfere with central area, CA, of the active area 330A of light detector 330 detecting the on axis light rays 392. For example, off axis light rays 396, 397 may be guided by lens assembly 310 to peripheral areas, PA1, PA2 of the active area 330A of light detector 330, away from the central area, CA, of light detector 330, and away from where the central area, CA, of the active area 330A of light detector 330 is located. Accordingly, by guiding off axis light rays 396, 397 to the peripheral areas, PA1, PA2, lens assembly 310 can substantially limit scattering and/or interference of off axis light rays 396, 397 from being received at the central area, CA, of the light detector 330. In particular, by guiding off axis rays 396, 397 to peripheral areas, PA1, PA2, lens assembly 310 can substantially limit scattering and/or interference of off axis light rays 396, 397 from being detected at the central area, CA, of the active area 330A of light detector 330. It should be understood that in the various previous figures just discussed, the optical assembly 300 may be embodied as the active near infrared image sensor 300 and/or the gesture sensor 300 and/or image sensor 300 and/or optical proximity sensor 300.

Figure 4B:
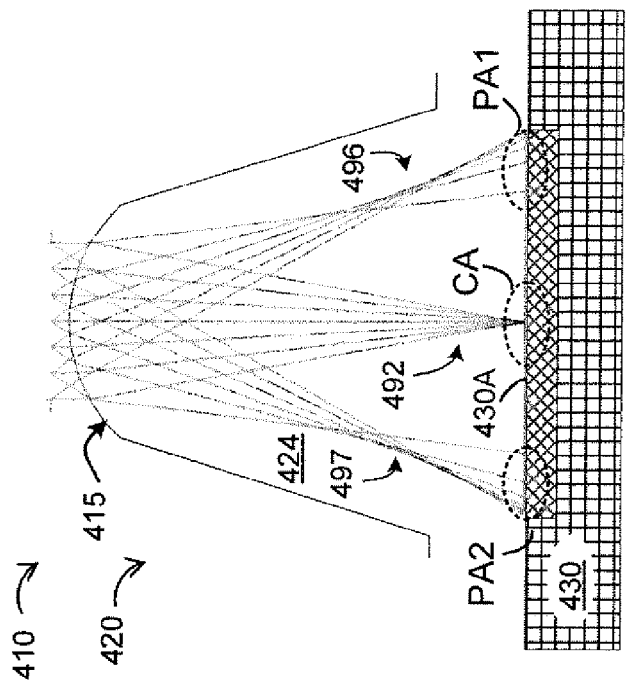
FIG. 4B shows optical operation in a further simplified partial cutaway side view of the optical assembly embodiment as shown in FIG. 4A.
Figure 4A:
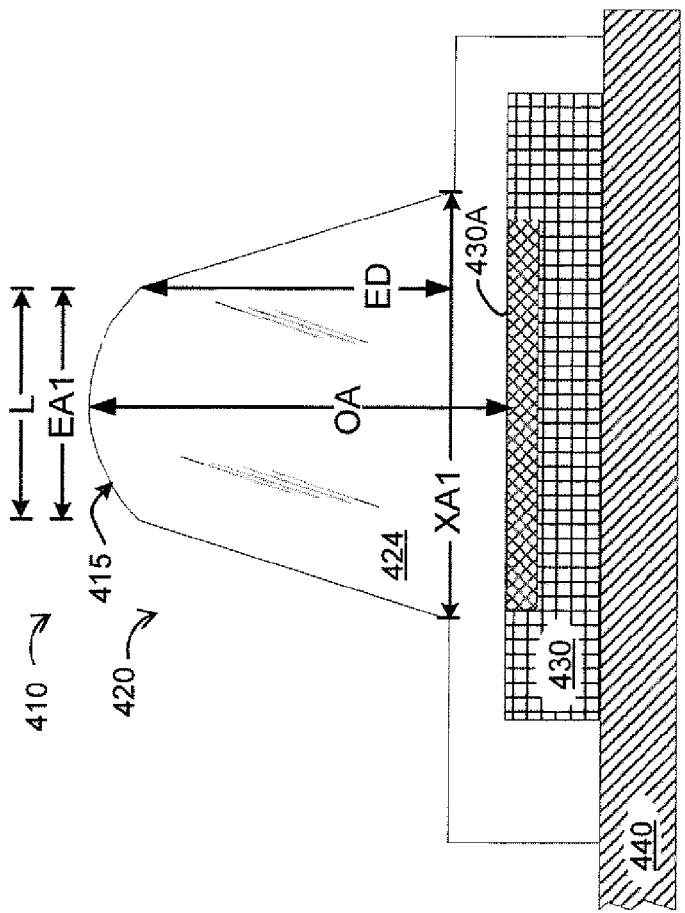
FIG. 4A shows a simplified partial cutaway side view of yet another embodiment of the optical assembly.

FIG. 4A shows a simplified partial cutaway side view of yet another embodiment of the optical assembly. FIG. 4B shows optical operation in a further simplified partial cutaway side view of the optical assembly embodiment as shown in FIG. 4A. FIGS. 4A and 4B both show lens assembly 410, which may comprise focal lens surface 415 having an optical axis portion, OA, extending from the focal lens surface 415 to receiver die 430. Receiver die 430 may have the central area, CA, where the active area 430A of receiver die 430 may be located.

The lens assembly 410 may further comprise base portion 420 interposed between the focal lens surface 415 and receiver die 430 and configured to substantially limit scattering and/or interference from off axis rays 496, 497 from being received at the central area, CA, of the receiver die 430 via the focal lens surface 415. The base portion 420 may comprise solid optical member 424 having surface portion that can be substantially at least one of graduated or tapered or conical and extending from a receiver die area proximate to the light detector 430, to lens area proximate to the focal lens surface 415. As particularly shown in FIG. 4A, the lens assembly 410 can, or more particularly the solid optical member 424 of the base portion 420 of the lens assembly 410 can encapsulate at least a portion of the receiver die 430.

As indicated previously herein, the lens assembly 410 can be a high aspect ratio lens assembly 410, optically coupled with the receiver die 430. in particular, the solid optical member 424 can be an elongated optical member 424 of the high aspect ratio lens assembly 410 having a narrow extremity arranged proximate to the focal lens surface 415 and a broad extremity arranged proximate to the receiver die 430. An elongated dimension, ED, of the elongated optical member 424 can extend from the narrow extremity of the elongated optical member 424 to the broad extremity of the elongated optical member 424, substantially along at least the majority of the portion of the optical axis, OA, of the focal lens surface, extending from the focal lens surface 415 to the receiver die 430. The elongated dimension, ED, of the elongated optical member 424 of the high aspect ratio lens assembly 410 can be substantially greater than a width dimension of the narrow extremity of the elongated optical member 424 of the high aspect ratio lens assembly 410, so as to provide the high aspect ratio of the high aspect ratio lens assembly 410. Further, the elongated optical member 424 can be interposed along the elongated dimension, between the focal lens surface 415 and the receiver die 430, so as to provide the high aspect ratio of the high aspect ratio lens assembly 410. Moreover, ratio of the elongated dimension, ED, of the elongated optical member 424 to the width dimension of the narrow extremity of the elongated optical member 424 can be substantially greater than approximately 1:1, so as to provide the high aspect ratio of the high aspect ratio lens assembly 410. Similarly, ratio of the elongated dimension of the elongated optical member 424 to width of the lens aperture, L, (and/or to width of the optical member entry aperture, EA1,) can be substantially greater than approximately 1:1, so as to provide the high aspect ratio of the high aspect ratio lens assembly 410.

Base portion 420 of the lens assembly can be interposed in base portion arrangement between the focal lens surface 415 and the receiver die 430 configured to substantially limit scattering and/or interference from off axis rays 496, 497 from being received at the central area, CA, of the receiver die 430 via the focal lens surface 415. Base portion 420 of the lens assembly 410 can comprise solid optical member 424 extending substantially along at least the majority of the portion of the optical axis, OA, of the focal lens surface, extending from the focal lens surface 415 to the receiver die 430. The solid optical member 424 may comprise member surface portion that can be substantially at least one of graduated or tapered or conical and extending from receiver die area proximate to the receiver die to lens area, proximate to the focal lens surface 415.

The focal lens surface 415 can have lens aperture, L, as shown in FIG. 4A. The solid optical member 424 may have optical member entry aperture, EA1, arranged proximate to the lens aperture, L, of the focal lens surface 415 and configured to substantially limit scattering and/or interference from off axis rays 496, 497 from being received at the central area of the receiver die 430 via the focal lens surface 415. For the embodiment shown in FIGS. 4A and 4B, the optical member entry aperture, EA1, of the solid optical member 424 need not necessarily be substantially larger than the lens aperture, L, of the focal lens surface 415. For the embodiment shown in FIGS. 4A and 4B, the optical member entry aperture, EA1, of the solid optical member 424 shown in FIG. 4A may be approximately the same size as the lens aperture, L, of the focal lens surface 415.

The solid optical member 424 may have optical member exit aperture, XA1, arranged proximate to the receiver die 430 and configured to substantially limit scattering and/or interference from off axis rays 496, 497 from being received at the central area, CA, of the receiver die 430 via the focal lens surface 415. The optical member entry aperture, EA1, and the optical member exit aperture, XA1, can be interposed between the focal lens surface 415 and the receiver die 430 as shown in FIG. 4A and can be configured to operate together so as to substantially limit scattering and/or interference from off axis rays 496, 497 from being received at the central area, CA, of the receiver die 430 via the focal lens surface 415.

As particularly shown in optical operation as depicted in FIG. 4B, in addition to being configured to collect the on axis light ray 492 to the central area, CA, of active area 430A of light detector 430, the lens assembly 410 (and more particularly components thereof) can also be configured to collect the off axis light rays 496, 497 (and/or chief rays 496, 497) and to guide off axis light rays 496, 497 to peripheral areas PA1, PA2 of active area 430A of light detector 430. Accordingly, by guiding off axis rays 496, 497 to the peripheral areas PA1, PA2, the lens assembly 410 can limit scattering and/or interference of off axis light rays 496, 497 at the central area, CA, of the light detector 430 via focal lens surface 415. The focal lens surface 415 can receive on axis light rays 492 as well as off axis light rays 496, 497. Otherwise possible surface scattering of off axis light rays 496, 497, if not substantially avoided, could otherwise interfere with central area, CA, of the active area 430A of light detector 430 detecting the on axis light rays 492. For example, off axis light rays 496, 497 may be guided by lens assembly 410 to peripheral areas, PA1, PA2 of the active area 430A of light detector 430, away from the central area, CA, of light detector 430, and away from where the central area, CA, of the active area 430A of light detector 430 is located. Accordingly, by guiding off axis light rays 496, 497 to the peripheral areas, PA1, PA2, lens assembly 410 can substantially limit scattering and/or interference of off axis light rays 496, 497 from being received at the central area, CA, of the light detector 430. In particular, by guiding off axis rays 496, 497 to peripheral areas, PA1, PA2, lens assembly 410 can substantially limit scattering and/or interference of off axis light rays 496, 497 from being detected at the central area, CA, of the active area 430A of light detector 430.

In other words, it should be understood that while guiding off axis light rays 496, 497 to peripheral areas, PA1, PA2, the foregoing arrangement can substantially avoid otherwise surface scattering the off axis light rays 496, 497 into the central area, CA, of active area 430A, located at the central area, CA of the receiver die 430.

In order to provide for substantially avoiding surface scattering of off axis light rays 496, 497 into the central area, CA, of active area 430A located at the central area, CA, of receiver die 430 via focal lens surface 415: the optical member exit aperture, XA1, of the solid optical member 424 can be configured to be substantially larger than the lens aperture, L, of the focal lens surface 415; and the optical member exit aperture, XA1, of the solid optical member 424 can be configured to be substantially larger than the optical member entry aperture, EA1, of the solid optical member 424; and member surface portion of solid optical member 424 can be substantially at least one of graduated or tapered or conical and extending from receiver die area, proximate to the receiver die to lens area, proximate to the focal lens surface.

FIG. 5A shows a simplified partial cutaway side view of further yet another embodiment of the optical assembly. FIG. 5B shows optical operation in a further simplified partial cutaway side view of the optical assembly embodiment as shown in FIG. 5A. FIGS. 5A and 5B both show lens assembly 510, which may comprise focal lens surface 515 having an optical axis portion, OA, extending from the focal lens surface 515 to receiver die 530. Receiver die 530 may have the central area, CA, where the active area 530A of receiver die 530 may be located.

The lens assembly 510 may further comprise base portion 520 interposed between the focal lens surface 515 and receiver die 530 and configured to substantially limit scattering and/or interference from off axis rays 596, 597 from being received at the central area, CA, of the receiver die 530 via the focal lens surface 515. As particularly shown in FIG. 5A, the lens assembly 510 can, or more particularly the solid optical member 524 of the base portion 520 of the lens assembly 510 can encapsulate at least a portion of the receiver die 530.

Optically speaking, the lens assembly 510 can be a high optical aspect ratio lens assembly 510, optically coupled with the receiver die 530. In particular, the solid optical member 524 can be an elongated optical member 524 of the high optical aspect ratio lens assembly 510. An elongated dimension, ED, of the elongated optical member 524 can extend substantially along at least the majority of the portion of the optical axis, OA, of the focal lens surface, extending from the focal lens surface 515 to receiver die 530. Ratio of the elongated dimension, ED, of the elongated optical member 524 to width of the lens aperture, L, can be substantially greater than approximately 1:1, so as to provide the high optical aspect ratio of the high optical aspect ratio lens assembly 510.

Base portion 520 of the lens assembly can be interposed in base portion arrangement between the focal lens surface 515 and the receiver die 530 configured to substantially limit scattering and/or interference from off axis rays 596, 597 from being received at the central area, CA, of the receiver die 530 via the focal lens surface 515. Base portion 520 of the lens assembly 510 can comprise solid optical member 524 extending substantially along the majority of the portion of the optical axis, OA, of the focal lens surface, extending from the focal lens surface 515 to the receiver die 530.

The focal lens surface 515 can have lens aperture, L, as shown in FIG. 5A. The solid optical member 524 may have optical member entry aperture, EA1, arranged proximate to the lens aperture, L, of the focal lens surface 515 and configured to substantially limit scattering and/or interference from off axis rays 596, 597 from being received at the central area of the receiver die 530 via the focal lens surface 515. For the embodiment shown in FIGS. 5A and 5B, the optical member entry aperture, EA1, of the solid optical member 524 may be substantially larger than the lens aperture, L, of the focal lens surface 515. A peripheral portion of the optical member entry aperture, EA1, of the solid optical member 524 may be roughened (or, more generally, may have a light transmission blocking treatment) so as to substantially block light transmission through the peripheral portion of the optical member entry aperture, EA1, of the solid optical member 524. In particular, the peripheral portion of the optical member entry aperture, EA1, that is substantially larger than the lens aperture, L, may be roughened (or, more generally, may have the light transmission blocking treatment) so as to substantially block light transmission through the peripheral portion of the optical member entry aperture, EA1.

The solid optical member 524 may have optical member exit aperture, XA1, arranged proximate to the receiver die 530 and configured to substantially limit scattering and/or interference from off axis rays 596, 597 from being received at the central area, CA, of the receiver die 530 via the focal lens surface 515. For the embodiment shown in FIGS. 5A and 5B, the optical member exit aperture, XA1, shown in FIG. 5A may be approximately the same size as the optical member entry aperture, EA1, of the solid optical member 524.

As particularly shown in optical operation as depicted in FIG. 5B, in addition to being configured to collect the on axis light ray 592 to the central area, CA, of active area 530A of light detector 530, the lens assembly 510 (and more particularly components thereof) can also be configured to collect the off axis light rays 596, 597 (and/or chief rays 596, 597) and to guide off axis light rays 596, 597 to peripheral areas PA1, PA2 of active area 530A of light detector 530. Accordingly, by guiding off axis rays 596, 597 to the peripheral areas PA1, PA2, the lens assembly 510 can limit scattering and/or interference of off axis light rays 596, 597 at the central area, CA, of the light detector 530 via focal lens surface 515. The focal lens surface 515 can receive on axis light rays 592 as well as off axis light rays 596, 597. Otherwise possible surface scattering of off axis light rays 596, 597, if not substantially avoided, could otherwise interfere with central area, CA, of the active area 530A of light detector 530 detecting the on axis light rays 592. For example, off axis light rays 596, 597 may be guided by lens assembly 510 to peripheral areas, PA1, PA2 of the active area 530A of light detector 530, away from the central area, CA, of light detector 530, and away from where the central area, CA, of the active area 530A of light detector 530 is located. Accordingly, by guiding off axis light rays 596, 597 to the peripheral areas, PA1, PA2, lens assembly 510 can substantially limit scattering and/or interference of off axis light rays 596, 597 from being received at the central area, CA, of the light detector 530. In particular, by guiding off axis rays 596, 597 to peripheral areas, PA1, PA2, lens assembly 510 can substantially limit scattering and/or interference of off axis light rays 596, 597 from being detected at the central area, CA, of the active area 530A of light detector 530.

In other words, it should be understood that while guiding off axis light rays 596, 597 to peripheral areas, PA1, PA2, the foregoing arrangement can substantially avoid otherwise surface scattering the off axis light rays 596, 597 into the central area, CA, of the active area 530A located at the central area, CA, of the receiver die 530.

In order to provide for substantially avoiding surface scattering of off axis light rays 596, 597 into the central area, CA, of active area 530A located at the central area, CA, of receiver die 530 via focal lens surface 515: the optical member exit aperture, XA1, of the solid optical member 524 can be configured to be substantially larger than the lens aperture, L, of the focal lens surface 515; and the optical member entry aperture, EA1, of the solid optical member 524 can be configured to be substantially larger than the lens aperture, L, of the focal lens surface 515.

Figure 6:
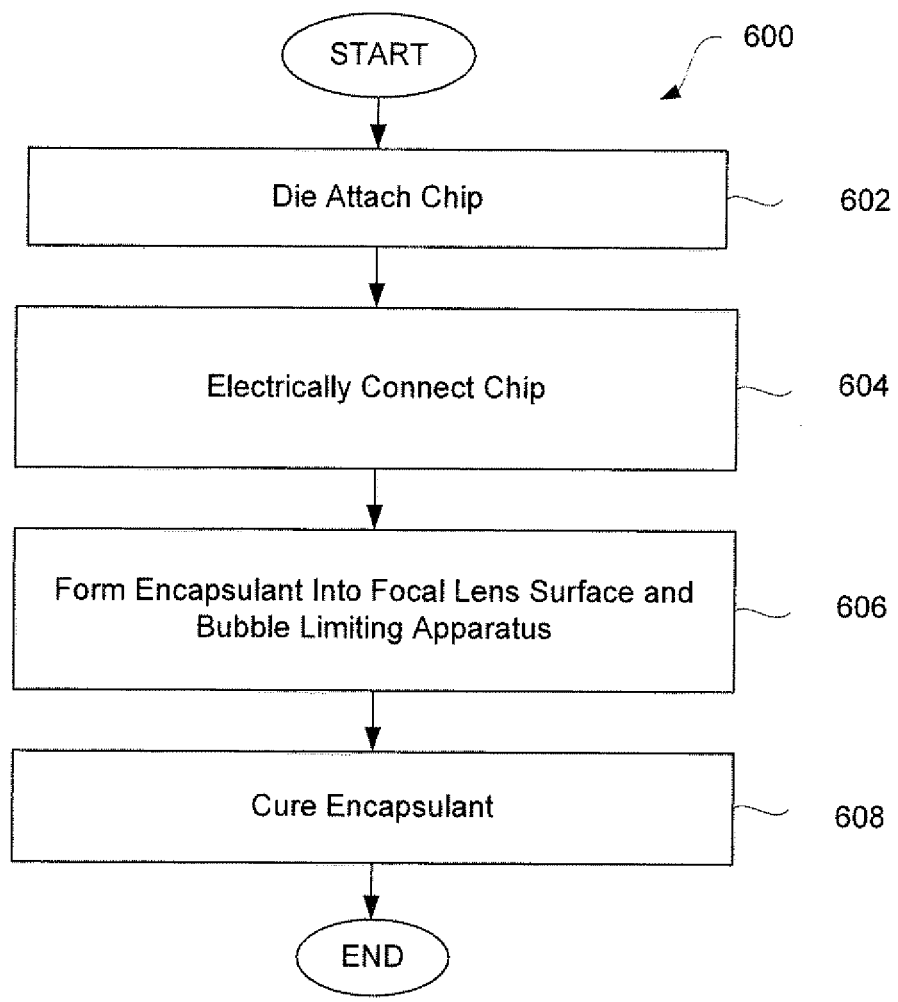
FIG. 6 shows a flowchart describing a method of making an optical assembly.

FIG. 6 shows a flowchart describing a method 600 of making an optical assembly. In block 602, a receiver chip is die-attached to a first portion of a substrate. In block 604, a first terminal of the receiver chip is electrically connected to a first lead of the device, wherein the first lead extends from the first portion of the substrate.

In block 606, uncured elastomeric encapsulant is formed in liquid form (for example, using a mold) into a focal lens surface and a bubble limiting apparatus configured to substantially limit presence of bubbles between the focal lens surface and the receiver die. The bubble limiting apparatus may comprise a solid optical member having a surface that is substantially at least one of graduated or tapered or conical and extending from an optical exit aperture of the solid optical member to an optical entry aperture of the solid optical member that is smaller than the optical exit of the solid optical member and configured to substantially limit presence of bubbles between the focal lens surface and the receiver die, when forming the solid optical member from the uncured elastomeric encapsulant in liquid form.

In block 606, the elastomeric encapsulant can be cured into solid form. Once the elastomeric encapsulant is cured into solid form, the method 600 can end.

Different aspects, embodiments or implementations may, either individually and/or in combination, but need not, yield one or more of the following advantages. For example, on axis and off axis light rays can be guided by a lens assembly along differing optical paths, after both are received by a lens surface. Components of the lens assembly can be configured to guide the on axis light ray from the lens surface, through a lens aperture, and an optical member exit aperture, to a central area of a light detector, so as to optically detect the on axis light ray. However, in contrast, components of the lens assembly can be configured to guide the off axis light ray from the lens surface to a peripheral area, away from the central area of the light detector. By guiding the off axis light ray to the peripheral area, components of the lens assembly can be configured to substantially limit scattering and/or interference from the off axis light ray from being detected at the central area of the light detector. While guiding the off axis ray to the peripheral area, the foregoing arrangement can substantially avoid otherwise surface scattering the off axis light ray to the central area of the light detector. In order to provide for substantially avoiding surface scattering the off axis light ray to the central area of the light detector via focal lens surface, an optical member exit aperture of a solid optical member can be configured to be substantially larger than a lens aperture of the lens surface. In some embodiments, the lens assembly can be a high aspect ratio lens assembly. In some embodiments, a surface portion of the solid optical member can be substantially at least one of graduated or tapered or conical. Further, the surface portion that is substantially at least one of graduated or tapered or conical may substantially limit presence of bubbles between the lens surface and the light detector, when the lens assembly is initially molded in liquid form, prior to being cured into solid form.

This application references U.S. patent application Ser. No. 13/934,132, filed Jul. 2, 2013, and entitled "Infrared Attenuating Or Blocking Layer In Optical Proximity Sensor", which is hereby incorporated by reference.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

What is claimed is:

1. An optical assembly comprising:
a receiver die having a central area;
a lens assembly optically coupled with the receiver die and encapsulating at least a portion of the receiver die, wherein the lens assembly comprises a focal lens surface having an optical axis portion extending from the focal lens surface to the receiver die, and
wherein the lens assembly further comprises a base portion interposed in a base portion arrangement between the focal lens surface and the receiver die configured to substantially limit off axis rays at the central area of the receiver die collected via the focal lens surface.

2. An optical assembly as recited in claim 1 wherein the base portion of the lens assembly comprises an optical barrier perimeter.

3. An optical assembly as recited in claim 2 wherein the optical barrier perimeter comprises an optical barrier surface that is substantially at least one of graduated or tapered or conical and extending from a receiver die area proximate to the receiver die to a lens area proximate to the focal lens surface.

4. An optical assembly as recited in claim 2 wherein the optical barrier perimeter has a longitudinal dimension extending substantially along at least a majority of the optical axis portion of the focal lens surface, from proximate the focal lens surface to proximate the receiver die.

5. An optical assembly as recited in claim 1 wherein the base portion of the lens assembly comprises a solid optical member extending substantially along at least a majority of the optical axis portion of the focal lens surface, from proximate the focal lens surface to proximate the receiver die.

6. An optical assembly as recited in claim 5 wherein the solid optical member encapsulates at least the portion of the receiver die.

7. An optical assembly as recited in claim 5 wherein the solid optical member comprises a member surface that is substantially at least one of graduated or tapered or conical and extending from a receiver die area proximate to the receiver die to a lens area proximate to the focal lens surface.

8. An optical assembly as recited in claim 5 wherein:
the focal lens surface has a lens aperture; and
the solid optical member has an optical member entry aperture arranged proximate to the lens aperture of the focal lens surface and configured to limit off axis rays at the central area of the receiver die collected via the focal lens surface.

9. An optical assembly as recited in claim 8 wherein the optical member entry aperture of the solid optical member is substantially larger than the lens aperture of the focal lens surface.

10. An optical assembly as recited in claim 5 wherein, the solid optical member has an optical member exit aperture arranged proximate to the receiver die and configured to substantially limit off axis rays at the central area of the receiver die collected via the focal lens surface.

11. An optical assembly as recited in claim 5 wherein the solid optical member has an optical member entry aperture and an optical member exit aperture interposed between the focal lens surface and the receiver die and configured to substantially limit off axis rays at the central area of the receiver die collected via the focal lens surface.

12. An optical assembly as recited in claim 5 wherein the focal lens surface has a lens aperture, and the solid optical member has an optical member exit aperture, and wherein the optical member exit aperture of the solid optical member is substantially larger than the lens aperture of the focal lens surface.

13. An optical assembly as recited in claim 5 wherein the solid optical member has an optical member entry aperture and an optical member exit aperture, and wherein the solid optical member extends from the optical member entry aperture to the optical member exit aperture along a majority of optical axis portion of the focal lens surface, from proximate the focal lens surface to proximate the receiver die.

14. An optical assembly as recited in claim 5 wherein the solid optical member comprises a wavelength selective member that is substantially transparent to a first wavelength of light and substantially blocks a second wavelength of light, wherein the first and second wavelengths are substantially different from one another.

15. An optical assembly as recited in claim 1 further comprising a bubble limiting apparatus configured to substantially limit presence of bubbles between the focal lens surface and the receiver die.

16. An optical assembly as recited in claim 15 wherein the bubble limiting apparatus comprises a solid optical member having a member surface portion that is substantially at least one of graduated or tapered or conical and extending from an optical exit aperture of the solid optical member to an optical entry aperture of the solid optical member that is smaller than the optical exit aperture of the solid optical member and configured to substantially limit presence of bubbles between the focal lens surface and the receiver die, when the solid optical member is initially molded in liquid form.

17. An apparatus comprising:
a receiver die; and
a high aspect ratio lens assembly optically coupled with the receiver die,
wherein the high aspect ratio lens assembly comprises a lens surface and an elongated optical member having a narrow extremity arranged proximate to the lens surface and a broad extremity arranged proximate to the receiver die,
wherein the elongated optical member has an elongated dimension that is substantially greater than a width dimension of the narrow extremity, and
wherein the elongated optical member is interposed along the elongated dimension between the lens surface and the receiver die so as to provide the high aspect ratio of the high aspect ratio lens assembly.

18. An apparatus as recited in claim 17 wherein ratio of the elongated dimension to the narrow dimension is substantially greater than approximately 1:1.

19. A method of manufacturing a device comprising:
die-attaching a receiver chip to a first portion of a substrate;
electrically connecting a first terminal of the receiver chip to a first lead of the device, wherein the first lead extends from the first portion of the substrate;
forming uncured elastomeric encapsulant into a focal lens surface and a bubble limiting apparatus configured to substantially limit presence of bubbles between the focal lens surface and the receiver die; and
curing the elastomeric encapsulant.

20. A method as recited in claim 19 wherein the bubble limiting apparatus comprises a solid optical member having a surface that is substantially at least one of graduated or tapered or conical and extending from an optical exit aperture of the solid optical member to an optical entry aperture of the solid optical member that is smaller than the optical exit of the solid optical member and configured to substantially limit presence of bubbles between the focal lens surface and the receiver die, when forming the solid optical member from the uncured elastomeric encapsulant.

* * * * *